United States Patent
Wang

(10) Patent No.: US 8,044,525 B2
(45) Date of Patent: Oct. 25, 2011

(54) SUBSTRATE WITH CHECK MARK AND METHOD OF INSPECTING POSITION ACCURACY OF CONDUCTIVE GLUE DISPENSED ON THE SUBSTRATE

(75) Inventor: San-Chi Wang, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 12/760,120

(22) Filed: Apr. 14, 2010

(65) Prior Publication Data
US 2010/0193974 A1 Aug. 5, 2010

Related U.S. Application Data

(62) Division of application No. 12/188,489, filed on Aug. 8, 2008, now Pat. No. 7,727,852.

(30) Foreign Application Priority Data

Apr. 23, 2008 (TW) .............................. 97114907 A

(51) Int. Cl.
*H01L 23/544* (2006.01)
(52) U.S. Cl. ................................. 257/797; 257/E23.179
(58) Field of Classification Search .................. 257/797, 257/E23.179
See application file for complete search history.

(56) References Cited

U.S. PATENT DOCUMENTS

| | | | |
|---|---|---|---|
| 6,816,521 B2 * | 11/2004 | Zetterlund et al. | 372/29.021 |
| 6,992,735 B2 | 1/2006 | Kim | |
| 7,264,994 B2 | 9/2007 | Noda | |
| 7,264,997 B2 | 9/2007 | Kameyama et al. | |
| 7,750,457 B2 * | 7/2010 | Seko | 257/688 |
| 7,786,747 B2 * | 8/2010 | Shih et al. | 324/754.03 |
| 7,928,591 B2 * | 4/2011 | Chen | 257/797 |
| 2007/0052344 A1 | 3/2007 | Wen et al. | |
| 2007/0190747 A1 * | 8/2007 | Humpston et al. | 438/460 |

FOREIGN PATENT DOCUMENTS
CN 100381918 4/2008
* cited by examiner

*Primary Examiner* — Luan C Thai
(74) *Attorney, Agent, or Firm* — Thomas, Kayden, Horstemeyer & Risley, LLP

(57) ABSTRACT

The invention relates to a substrate with a check mark and a method of inspecting position accuracy of conductive glue dispensed on the substrate. The method is implemented on the substrate having at least one transfer pad and at least one check mark arranged near the border of the transfer pad. After the conductive glue spot is dispensed on the transfer pad, the method includes first capturing an image by a video capturing element, then determining whether the conductive glue spot exist in the image and determining whether the conductive glue spot from the image matches a predetermined standard, if not, generating a report and a warning.

5 Claims, 6 Drawing Sheets

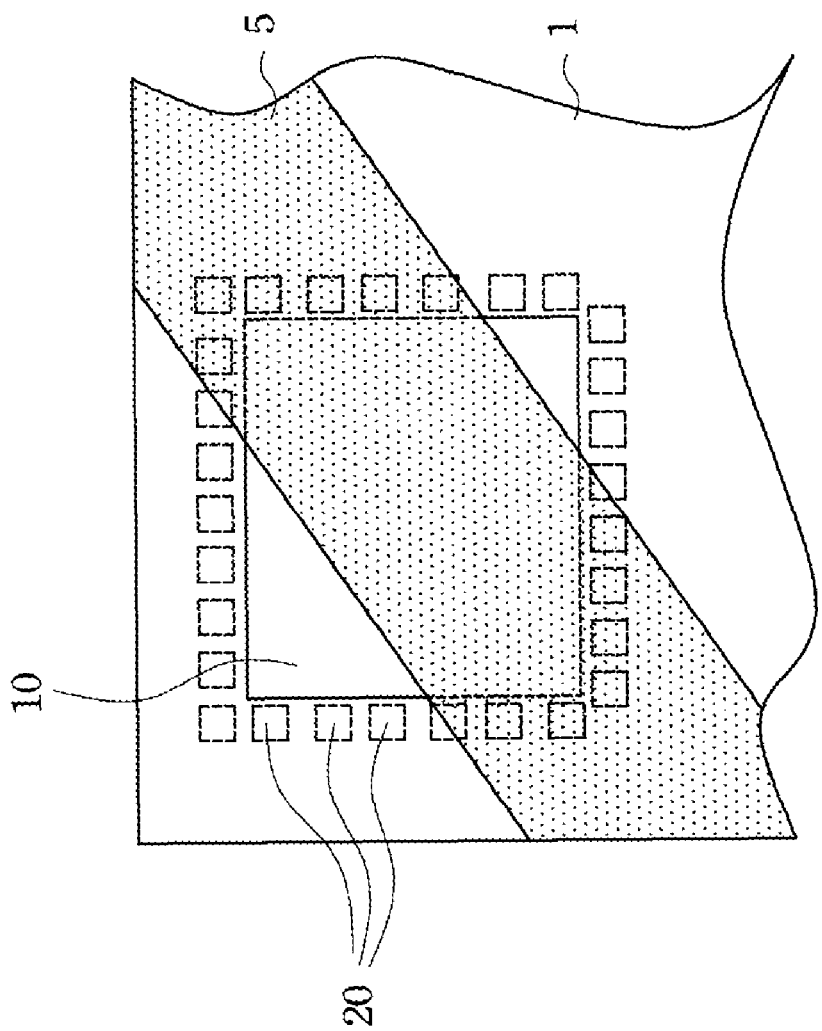

SUBSTRATE WITH CHECK MARK AND METHOD OF INSPECTING POSITION ACCURACY OF CONDUCTIVE GLUE DISPENSED ON THE SUBSTRATE

RELATED APPLICATIONS

This application is a division of U.S. patent application Ser. No. 12/188,489, filed on Aug. 8, 2008, now U.S. Pat. No. 7,727,852, which claimed priority to Taiwan Application Serial Number 97114907, filed Apr. 23, 2008, which is herein incorporated by reference.

BACKGROUND

1. Field of Invention

The present invention relates to a method of inspecting position accuracy of conductive glue dispensed on a substrate. More particularly, the present invention relates to a substrate with check mark(s) and a method utilizing the substrate to inspect whether the conductive glue is dispensed on the right position.

2. Description of Related Art

Before glass substrates such as a color filter substrate and an array substrate are assembled with each other, a transfer pad of the array substrate must be dispensed with conductive glue that has conductive grains therein, thus, after the color filter substrate is assembled on the array substrate, the array substrate and the color filter substrate are able to electrically connect with each other via the conductive glue therebetween.

In view of that, the appropriate quantity of the conductive glue and the correct position where the conductive glue being dispensed on the transfer pad are two important factors to the effectiveness and the reliability of signal transmission between the array substrate and the color filter substrate.

That is, when a conductive glue spot with appropriate quantity is detected on a checking zone of the transfer pad by an inspection machine, the inspection machine determines that the conductive glue spot is dispensed correctly. Thus, the conductive glue spot can provide effective signal transmission from the array substrate to the color filter substrate and then the assembled panel can display a qualified image.

However, until now the location of the checking zone center can only be oriented by a relative coordinate based on predetermined reference points on the glass, rather than identifying the location of the transfer pad directly. Therefore, the inspection machine might check a conductive glue spot with appropriate quantity but out of the transfer pad, so that the deviation of conductive glue spot degrades the signal transmission from the array substrate to the color filter substrate and causes the assembled displaying panel to have the problems about flicker and image sticking, and even lose efficacy.

In light of that, the area of the transfer pad is expanded in order to raise the chance of dropping the conductive glue onto the transfer pad. Thus, although the image quality is ensured by the effective signal transmission from the array substrate to the color filter the area of through enlarging the area of transfer pad, the larger area of transfer pad may also decrease the number of panel that can be cut from the glass substrates and reduce the usage of the glass substrates.

SUMMARY

In view of the foregoing, a first aspect of the present invention is to reduce bad signal transmission and image flickering or sticking effect after the glass substrate and the color filter substrate are assembled.

A second aspect of the present invention is to detect the deviation of drop of conductive glue.

A third aspect of the present invention is to downsize the transfer pad in order to improve the usage of the glass substrate and to increase the number of panel that can be cut from the glass substrate.

Therefore, the present invention is directed to a substrate having at least one transfer pad and at least one check mark. The check mark is arranged on the substrate near the border of the transfer pad. When a conductive glue spot is formed on the transfer pad by a glue nozzle, the check mark near the transfer pad is utilized as a reference for inspecting whether a conductive glue spot matches a standard and is located correctly on the transfer pad.

The invention also discloses a method of inspecting the position accuracy of conductive glue dispensed on a substrate. The method can be implemented on the foregoing substrate after a conductive glue spot is formed on the transfer pad. The method includes the steps of capturing an image of the transfer pad alone or with check marks by a video capturing element, then determining whether the conductive glue spot is in the image and determining whether the conductive glue spot from the image matches a predetermined standard, and if not, providing a report and a warning.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 4 is a schematic view of a seal overlapping on the check marks and the substrate of the FIG. 3D.

DESCRIPTION OF THE PREFERRED EMBODIMENTS

Figure 1:
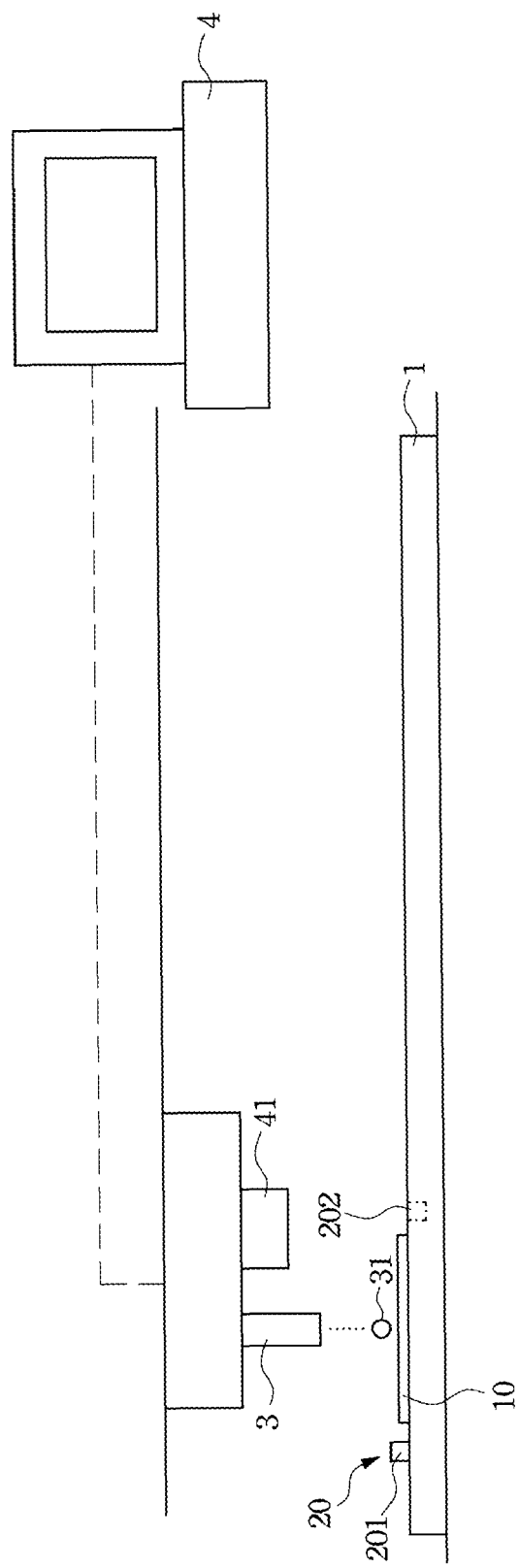
FIG. 1 is an operational schematic view of a substrate being dispensed with conductive glue according to the present invention.
Figure 2:
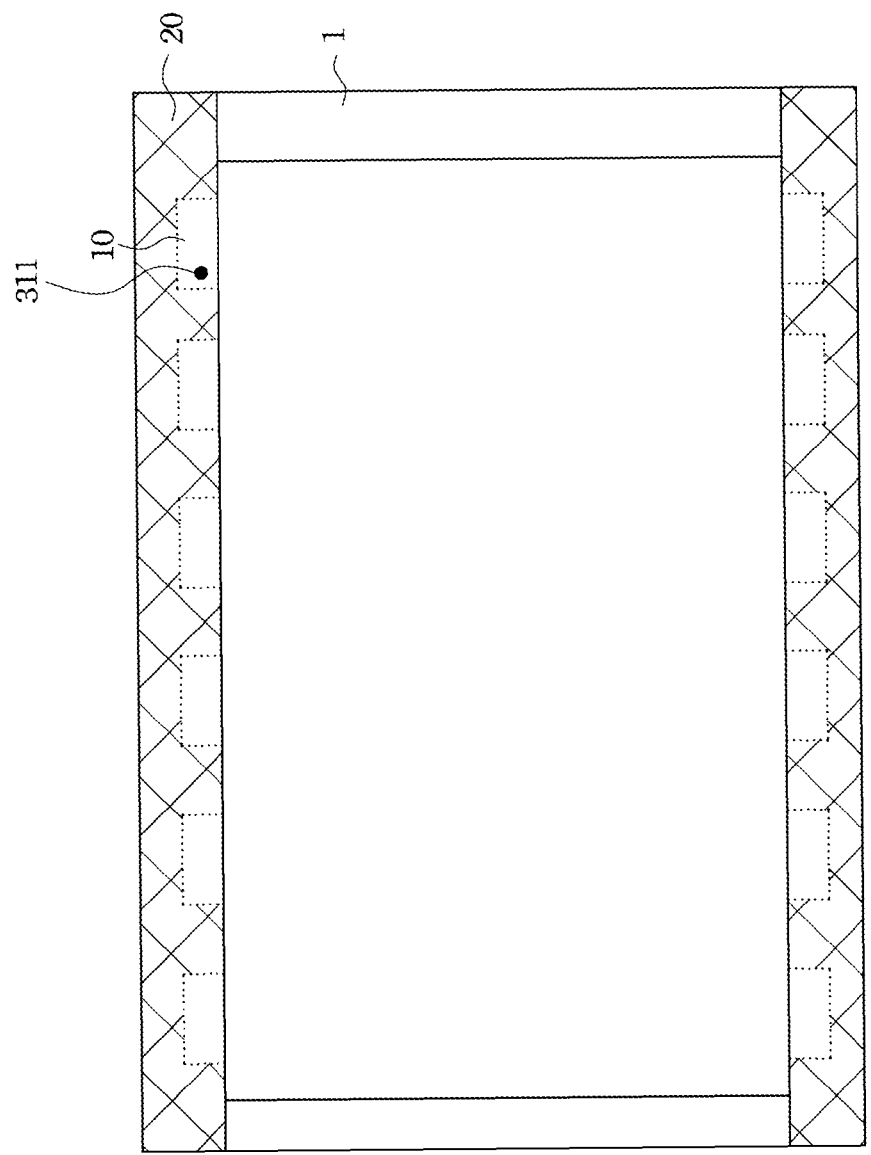
FIG. 2 is a top view of check marks arranged on the substrate according to an embodiment according to the present invention.

The present invention relates to a substrate with check mark(s) and a method of inspecting position accuracy of conductive glue dispensed on the substrate. FIG. 1 is an operational schematic view of a substrate being dispensed with conductive glue of the present invention, and FIG. 2 is a schematic view of check marks arranged on the substrate according to an embodiment of the present invention.

The substrate 1, a thin-film transistor array substrate or a color filter substrate for example, has a number of transfer pads 10 thereon and each transfer pad 10 has one or more check marks 20 disposed neighboring the border thereof. The check mark(s) 20 can appear as protrusion(s) 201, hole(s) 202 or flat mark(s) arranged neighboring the border of the transfer pad 10.

When conductive glue 31 is outputted by a glue nozzle 3 towards one of the transfer pads 10 based on a given coordinate and forms a conductive glue spot 311 on the transfer pad 10, a video capturing element 41 of an automated optical inspection 4 (AOI) then captures an image of the transfer pad 10 and determines whether the conductive glue spot 311 in the image matches a predetermined standard.

In this embodiment, the video capturing element 41 and the glue nozzle 3 are disposed on the same apparatus. However, the video capturing element 41 and the glue nozzle 3 in the invention can also be disposed separately, and the type of the video capturing element 41 is not limited.

Figure 3A:
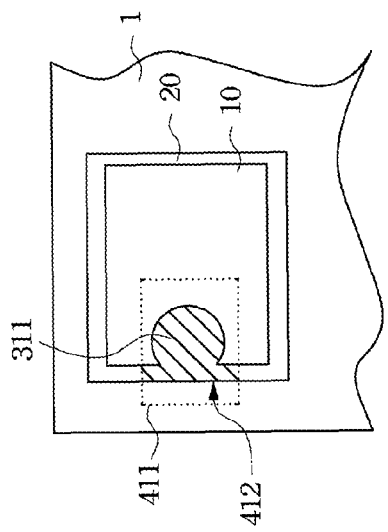
FIG. 3A is a schematic view of a first type of check mark and a conductive glue spot in a captured image according to an embodiment of the present invention.
Figure 3B:
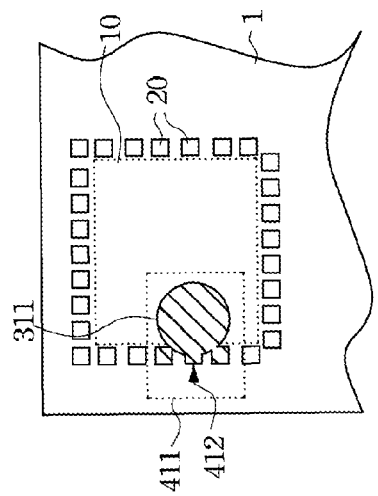
FIG. 3B is a schematic view of a complete contour by the conductive glue spot overlapping on the check mark of FIG. 3A in a captured image according to the embodiment of the present invention.
Figure 3C:
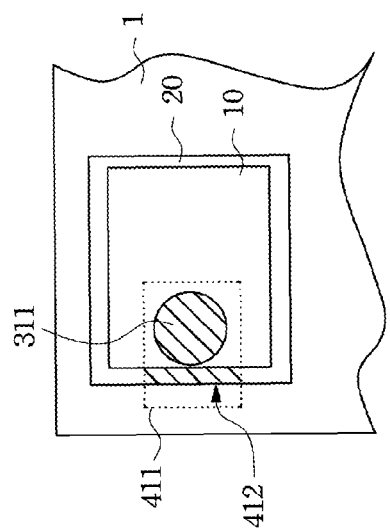
FIG. 3C is a schematic view of both a second type of check mark and a conductive glue spot overlapping the check mark as a complete contour in a captured image, according to the other embodiment of the present invention.
Figure 3D:
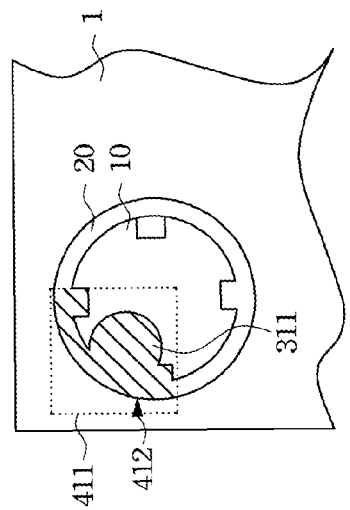
FIG. 3D is a schematic view of both a third type of check marks and a conductive glue spot overlapping the check marks as a complete contour in a captured image, according to another embodiment of the present invention.

FIG. 3A~FIG. 3D show schematic views of different types of check mark(s) 20 and the conductive glue spot 311 in an image 411 according to different embodiments of the present invention. The check mark 20 can be a squared-ring shaped enclosed contour or a round-ring shaped enclosed contour, as shown in FIG. 3A, FIG. 3B or FIG. 3C, to surround the border of the transfer pad 10, otherwise, the ring-shaped enclosed contour of the check marks 20 can be formed by some duplicated patterns surrounding the border of the transfer pad 10, but are not limited to the types. In this embodiment, the check marks 20 are some duplicated rectangular patterns as shown in FIG. 3D around the border of the transfer pad 10. The check mark(s) 20 can be any material such as metal (e.g. copper, tin or chromium etc.), plastic, silicon, resin, photoresist or others as long as those are able to be distinguished from the transfer pad 10 in the image 411 to compare the check marks 20 with the predetermined standard.

In the invention, there is no any limit on the amount of the check marks 20 and their relative positions. Therefore, the check marks 20 such as the protrusions 201 may at least partially overlap to the transfer pad 10 or stand alone neighboring to the border of the transfer pad 10. The check marks 20 can be disposed neighboring at least one side of the border of the transfer pad 10 as long as the rest sides of the border of the transfer pad 10 are controlled by one of other monitoring systems.

FIG. 4 is a schematic view of a seal 5 overlapping the duplicated check marks 20 and the substrate 1 in the FIG. 3D. The seal 5 is a type of adhering glue (e.g. UV curing resin) that is solidified by absorbing UV rays, and the seal 5 is used to seal the substrate 1 with another substrate to form cells after the adhering glue is solidified.

When the seal 5 in a practical design partially overlaps the check marks 20, the seal 5 is exposed from the interval between the duplicated check marks 20 to absorb energy in the process of UV curing. Thus, the overlap between check marks 20 and seal 5 will not impede the solidification of seal 5.

Figure 5:
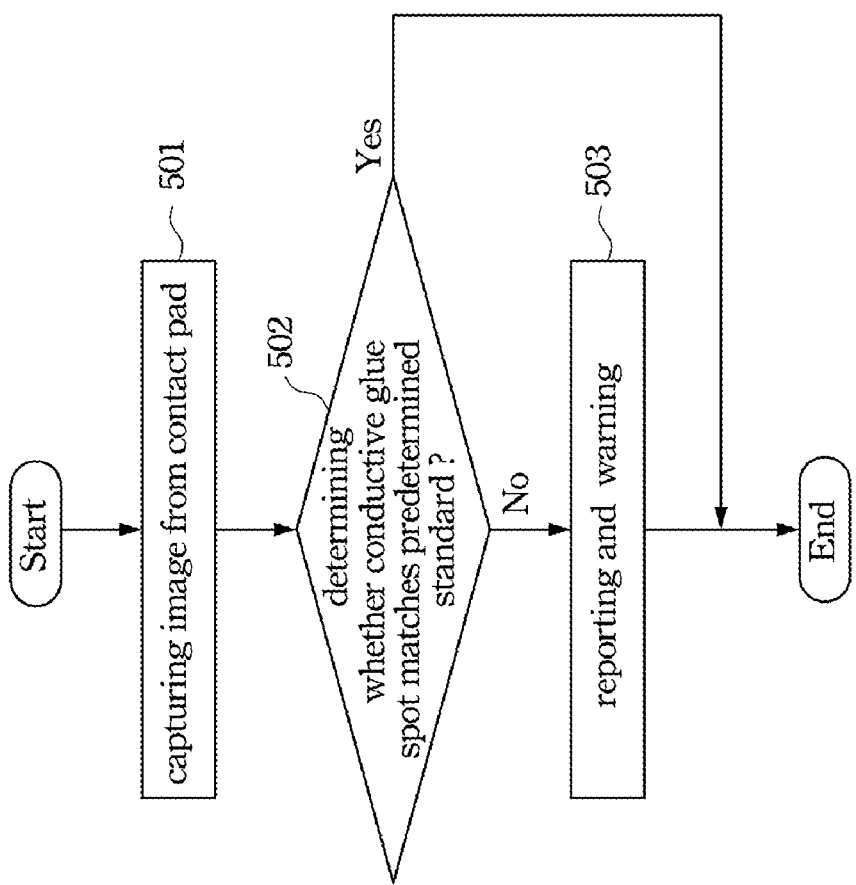
FIG. 5 is a flow chart illustrating a method of inspecting position accuracy of conductive glue dispensed on a substrate according to the present invention.

FIG. 5 is a flow chart illustrating a method of inspecting position accuracy of conductive glue dispensed on a substrate according to the present invention. The invention uses the check mark(s) 20 as reference for inspecting whether a conductive glue spot 311 matches a standard and locates on the transfer pad 10 correctly, thus, after a conductive glue spot 311 is deposited on the transfer pad 10, the AOI 4 follows the method to process steps as follows:

Step (501) capturing an image 411 from the transfer pad 10:

Since the video capturing element 41 and the glue nozzle 3 are disposed together in this embodiment, the glue nozzle 3 outputs conductive glue according to coordinate information and the video capturing element 41 captures the image 411 from the transfer pad 10 according to the same coordinate information.

If the image 411 from the transfer pad 10 with no conductive glue spot 311 thereon is detected, the AOI 4 could report and/or warn immediately or after all process steps, and if the image 411 with the conductive glue spot 311 thereon is detected, the AOI 4 processes step (502);

Step (502) determining whether the conductive glue spot 311 in the image 411 matches a predetermined standard:

If the conductive glue spot 311 and the transfer pad 10 with no check mark(s) 20 are found in the image 411, the conductive glue spot 311 in the image 411 of course matches the predetermined standard. However, this step is to discuss about how to judge the deviated conductive glue spot 311 in the image 411 matches/mismatches the predetermined standard when both the transfer pad 10 and the check mark(s) 20 are detected in the image 411.

The present invention introduces two ways of the predetermined standard as follows:

(i) determining whether a total area of both the conductive glue spot 311 and the check mark(s) 20 in the image 411 stays in a predetermined area range, where the predetermined area range can be set up by taking account of the normal variation of the conductive glue spot 311. For example, the range can be that the target of quantity of conductive glue 31 (i.e. expected quantity of the conductive glue 31) plus/minus the target's three times of standard deviation estimated from past observation.

When the total area thereof surpasses the upper limit, the AOI 4 reports a warning for the excess. On the other hand, when the total area thereof is beneath a lower limit, the AOI 4 reports another kind of warning for the deficiency.

The so-called predetermined area range might be changeable by taking several variables into account. These variables can be the areas of the conductive glue spot 311, the check mark(s) 20 and the transfer pad 10, the distance of capturing an image by the video capturing element 41, or the statistical figures obtained after a testing procedure.

Figure 6:
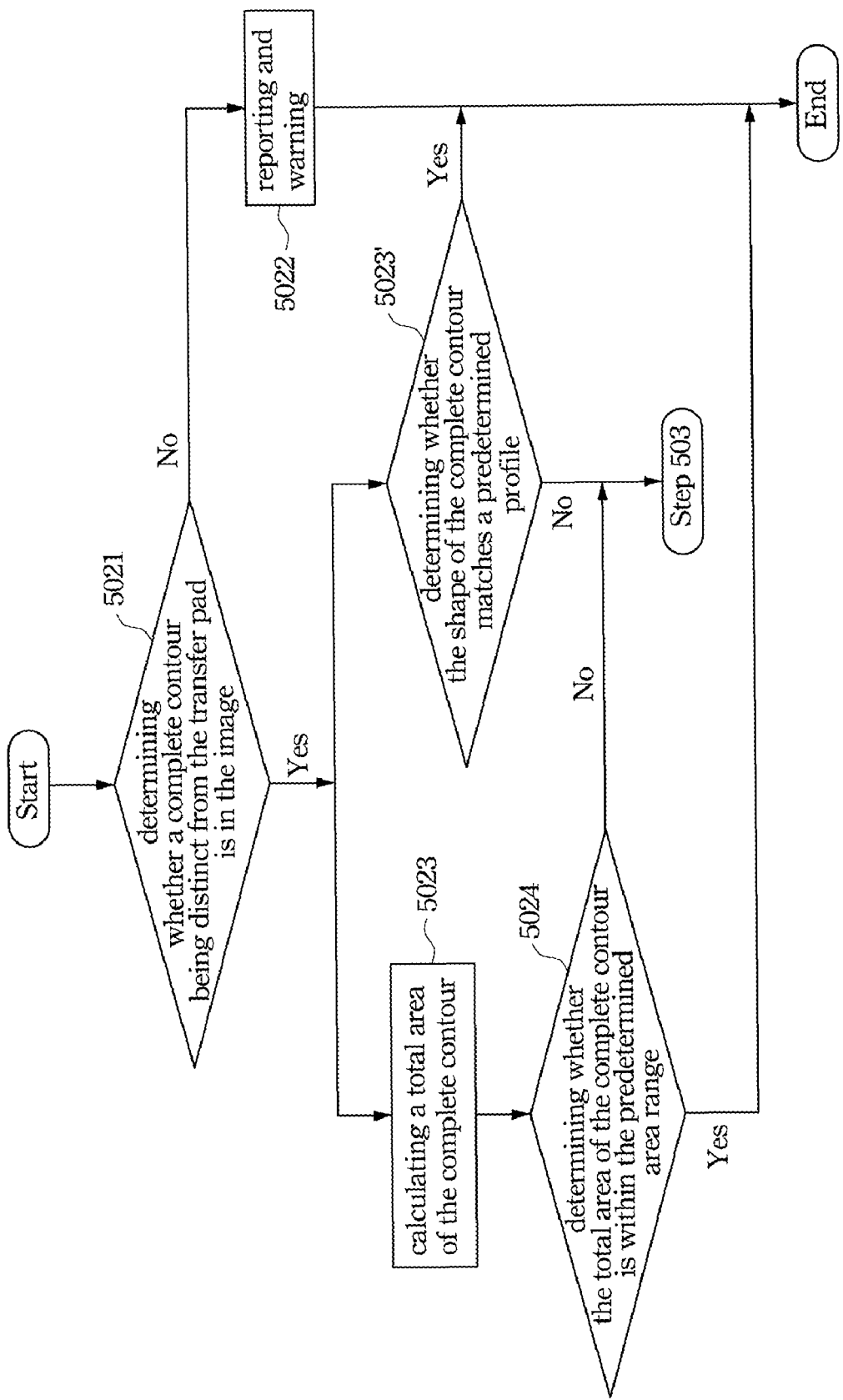
FIG. 6 is a flow chart illustrating two ways of the predetermined standard in the step 502 of the FIG. 5.

Refer to FIG. 6, is a flow chart illustrating two ways of the predetermined standard in the step 502 of the FIG. 5. In this embodiment, the details steps of the first way are disclosed as follows:

Step (5021): determining whether at least one complete contour 412 being distinct from the transfer pad 10 is in the image 411 (see FIG. 3A~FIG. 3D), if yes, go to step (5023), and if no, go to step (5022)

Step (5022): the AOI 4 also reports and warns if none of the complete contour 412 is in the image 411, and the inspecting method is finished.

Step (5023): calculating a total area of the complete contour(s) 412 when the complete contour(s) 412 being distinct from the transfer pad 10 is in the image 411; and Step (5024): determining whether the total area of the complete contour(s) 412 is within the predetermined area range The total area of the complete contour(s) 412 is compared with the predetermined area range. If the total area of the complete contour(s) 412 is within the predetermined area range, the conductive glue spot 311 in the image 411 matches the predetermined standard then the inspecting method is finished. Otherwise, if the total area of the complete contour(s) 412 in the image 411 is not within the predetermined area range, the conductive glue spot 311 in the image 411 does not match the predetermined standard then it goes to step (503).

(ii) determining whether a complete contour of both the conductive glue spot 311 and/or the check mark(s) 20 in the image 411 matches a predetermined profile, where the predetermined profile can be circular-shaped, and if the complete contour thereof mismatches the predetermined profile, the AOI 4 reports and warns immediately.

In this embodiment, see FIG. 6 as well, the details of second way are as follows:

Step (5021): determining whether a complete contour 412 being distinct from the transfer pad 10 is in the image 411 (see FIG. 3A~FIG. 3D) as same as the step (5021) in the first way, if yes, go to step (5023'), otherwise, go to step (5022).

Step (5022): the AOI 4 also reports and warns if none of the complete contour 412 is in the image 411, and then the inspecting method is finished.

Step (5023'): determining whether the shape of the complete contour 412 matches the predetermined profile when the complete contour 412 being distinct from the transfer pad 10 is in the image 411:

The shape of the complete contour 412 is compared with the predetermined profile, if the shape of the complete contour 412 matches the predetermined profile, the conductive glue spot 311 in the image 411 matches the predetermined standard, then the inspecting method is finished, if the shape of the complete contour 412 in the image 411 does not match the predetermined profile, the conductive glue spot 311 in the image 411 does not match the predetermined standard, then it goes to step (503).

The determining method in this embodiment for determining whether the shape of the complete contour 412 matches the circular profile is to determine whether a circularity value, L-S factor value or Roughness value of the complete contour 412 thereof within a predetermined scope.

Wherein the method for determining that circularity value of the complete contour 412 is within the predetermined scope, is firstly to calculate the circularity value of the complete contour 412, in which the circularity value of the complete contour 412 is (the circumference thereof $^2$)/($4*\pi*$the area thereof). Then, if the circularity value thereof is within 1~1.1, the complete contour 412 is approximate to the circular profile.

Wherein the method for determining that the L-S factor value of the complete contour 412 is within the predetermined scope, is firstly to calculate the L-S factor value of the complete contour 412, in which the L-S factor value of the complete contour 412 is (the maximum value of comparing the centroid and the boundary thereof)/(the minimum value of comparing the centroid and the boundary thereof). Then if the L-S factor value thereof is within 1~1.1, the complete contour 412 is approximate to the circular profile.

Wherein the method for determining that the roughness value of the complete contour 412 is within the predetermined scope, is firstly to calculate the roughness value of the complete contour 412, in which the roughness value of the complete contour 412 is (the actual circumference thereof)/(the regression circle thereof). Then if the roughness value thereof is within 1~1.1, the complete contour 412 is approximate to the circular profile.

Step (503) reporting, warning and stopping the output of the conductive glue 31 from the glue nozzle 3, when the conductive glue spot 311 mismatches the predetermined standard from the image 411.

Finally, the check mark(s) 20 here can be simultaneously formed with the manufacturing of the thin-film transistor array substrate and the color filter substrate. Namely, the check mark(s) 20 can be exposed with other units, circuits or layout patterns together in Photolithography technology during the forming of the metal layers, semiconductor layers, photoresist layers or BM layers. Thus, no issue of extra procedure and cost comes up.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A substrate with check mark, comprising:
   at least one transfer pad; and
   at least one check mark with a ring-shaped enclosed contour overlapping a border of the transfer pad at least partially to serve as a reference for inspecting a conductive glue spot on the transfer pad.

2. The substrate of claim 1, wherein the at least one check mark with the a ring-shaped enclosed contour surrounds the border of the transfer pad.

3. The substrate of claim 2, wherein the ring-shaped enclosed contour is a squared-ring shaped enclosed contour or a round-ring shaped enclosed contour.

4. The substrate of claim 2, wherein the ring-shaped enclosed contour is formed by some duplicated patterns arranged around the border of the transfer pad.

5. The substrate of claim 1, wherein at least one check mark consists of a plurality of protrusions arranged around the border of the transfer pad.

* * * * *